(12) United States Patent
Straeussnigg et al.

(10) Patent No.: US 10,034,089 B2
(45) Date of Patent: Jul. 24, 2018

(54) SENSOR ARRANGEMENT HAVING AN OPTIMIZED GROUP DELAY AND SIGNAL PROCESSING METHOD

(71) Applicant: Infineon Technologies AG, Neubiberg (DE)

(72) Inventors: Dietmar Straeussnigg, Villach (AT); Elmar Bach, Villach (AT); Alessandro Caspani, Villach (AT); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/643,506

(22) Filed: Jul. 7, 2017

(65) Prior Publication Data

US 2018/0014124 A1    Jan. 11, 2018

(30) Foreign Application Priority Data

Jul. 7, 2016  (DE) .................. 10 2016 112 488
Sep. 2, 2016  (DE) .................. 10 2016 116 421

(51) Int. Cl.
| | |
|---|---|
| H03G 5/00 | (2006.01) |
| H04R 3/04 | (2006.01) |
| H03G 3/30 | (2006.01) |
| H04R 19/04 | (2006.01) |
| H03G 5/16 | (2006.01) |

(52) U.S. Cl.
CPC ............ *H04R 3/04* (2013.01); *H03G 3/3005* (2013.01); *H03G 5/005* (2013.01); *H03G 5/16* (2013.01); *H04R 19/04* (2013.01); *H04R 2201/003* (2013.01)

(58) Field of Classification Search
USPC ....... 381/17, 57, 71.11, 71.12, 98, 106, 112, 381/122, 150, 312, 316
See application file for complete search history.

(56) References Cited

U.S. PATENT DOCUMENTS

| | | | | |
|---|---|---|---|---|
| 2006/0147069 | A1* | 7/2006 | Svajda ................. | H04R 25/554 |
| | | | | 381/316 |
| 2009/0085611 | A1* | 4/2009 | Rofougaran .......... | H03B 21/00 |
| | | | | 327/106 |
| 2010/0183172 | A1* | 7/2010 | Roeck ................. | H04R 25/453 |
| | | | | 381/150 |

(Continued)

FOREIGN PATENT DOCUMENTS

| | | |
|---|---|---|
| DE | 10103812 A1 | 8/2002 |
| DE | 102014116053 A1 | 5/2015 |

*Primary Examiner* — Yosef K Laekemariam
(74) *Attorney, Agent, or Firm* — Viering, Jentschura & Partner mbB

(57) ABSTRACT

In various embodiments, a circuit arrangement is provided. The circuit arrangement includes a sensor set up to provide an analogue signal, an analogue/digital converter set up to receive the analogue signal and to provide a first signal, and a first filter set up to receive a signal based on the first signal and to provide a second signal. The first filter is set up in such a manner that the second signal is allowed through without amplification or substantially without amplification in a frequency range of approximately 20 Hz to approximately 10 kHz, and the second signal has a gain of greater than 0 dB at least above a predefined frequency which is greater than approximately 20 kHz.

22 Claims, 10 Drawing Sheets

(56) References Cited

U.S. PATENT DOCUMENTS

| | | | |
|---|---|---|---|
| 2011/0099213 A1* | 4/2011 | Snelgrove | H03H 17/0219 |
| | | | 708/3 |
| 2013/0208923 A1* | 8/2013 | Suvanto | H04R 3/005 |
| | | | 381/122 |
| 2014/0177874 A1 | 6/2014 | Baogason et al. | |
| 2015/0131819 A1 | 5/2015 | Straeussnigg et al. | |

\* cited by examiner

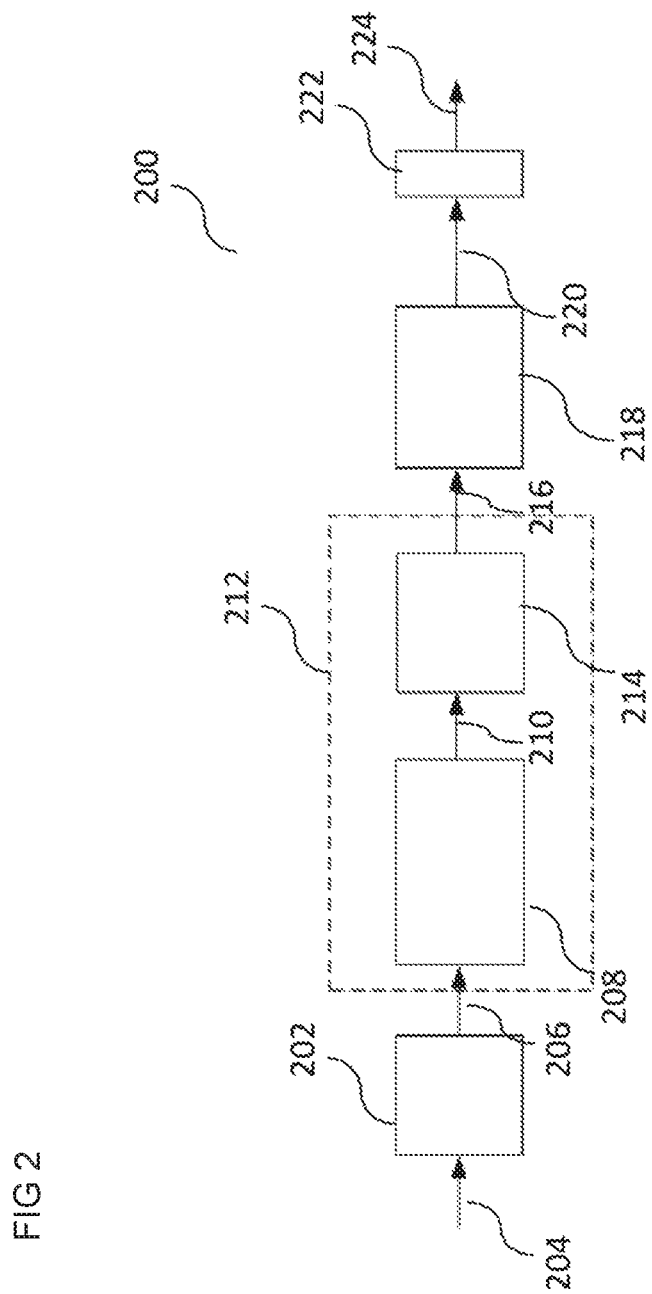

SENSOR ARRANGEMENT HAVING AN OPTIMIZED GROUP DELAY AND SIGNAL PROCESSING METHOD

CROSS-REFERENCE TO RELATED APPLICATION

This application claims priority to German Patent Application Serial No. 10 2016 112 488.5, which was filed Jul. 7, 2016, and is incorporated herein by reference in its entirety. This application further claims priority to German Patent Application Serial No. 10 2016 116 421.6, which was filed Sep. 2, 2016, and is incorporated herein by reference in its entirety.

TECHNICAL FIELD

Various embodiments relate generally to a sensor arrangement having an optimized group delay and to a signal processing method.

BACKGROUND

Sensor arrangements, for example microphones, are used to record ambient noises or ambient sound. In order to provide a good quality of the recorded sound or in order to meet customer requirements, a high degree of linearity, high signal-to-noise ratios (SNR) or the correspondence with a predefined spectral mask may be necessary for the response function of a microphone.

As illustrated in the block diagram in FIG. 9, a conventional microphone 900 has a microphone diaphragm 902, for example a micro-electromechanical diaphragm (MEMS). The diaphragm 902 is deflected from a rest position by means of sound-induced pressure fluctuations and in the process generates an analogue electrical signal which is amplified by means of an amplifier 904 or a read-out circuit, for example a source follower. The signal from the amplifier 904 is detected by a sensor circuit 908 at a sampling frequency Fs (706). The sensor circuit 908 has an analogue/digital converter 910 which converts the signal from the amplifier 904 into digital signals. The sensor circuit also has a digital filter 912 which blocks high-frequency digital signals from the analogue/digital converter 910 (low-pass filter). The filtered digital signals are converted into a customer-specific 1-bit output signal 916 by a modulator 914 which is connected to the digital filter 912.

The low-pass filter is needed to stabilize the arrangement and to attenuate an excessive increase in the MEMS frequency response. A group delay is associated with this arrangement.

In some applications, for example headset applications, it is necessary to acoustically suppress the ambient noise by means of a loudspeaker which is driven in anti-phase. In this case, the interfering ambient noise is measured using a microphone, is then digitally processed and is switched to the loudspeaker. The group delay of the microphone arrangement plays a great role in the suppression. This group delay is additively composed of the group delays of the microphone, the group delay of the digital signal processing in the sensor circuit and the group delay of the loudspeaker.

SUMMARY

In various embodiments, a circuit arrangement is provided. The circuit arrangement includes a sensor set up to provide an analogue signal, an analogue/digital converter set up to receive the analogue signal and to provide a first signal, and a first filter set up to receive a signal based on the first signal and to provide a second signal. The first filter is set up in such a manner that the second signal is allowed through without amplification or substantially without amplification in a frequency range of approximately 20 Hz to approximately 10 kHz, and the second signal has a gain of greater than 0 dB at least above a predefined frequency which is greater than approximately 20 kHz.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a block diagram of an embodiment of a sensor arrangement;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various embodiments used as an example will now be described more completely with reference to the attached drawing which illustrates some embodiments used as an example. In the figures, the thicknesses of lines, layers and/or regions may be exaggerated for reasons of clarity.

Even though further embodiments may accordingly have different modifications and alternative forms, some embodiments thereof which are used as an example are illustrated by way of example in the figures and are described in detail here. However, it should be understood that the intention is not to restrict embodiments used as an example to the specific forms disclosed, but rather, on the contrary, embodiments used as an example are intended to cover all modifications, equivalent configurations and alternatives which fall within the scope of protection of the invention. In the description of the figures, the same numbers relate to identical or similar elements.

Within the scope of this description, the terms "linked", "connected" and "coupled" are used to describe both a direct and an indirect link, a direct or indirect connection and direct or indirect coupling. In the figures, identical or similar elements are provided with identical reference symbols if this is expedient.

The terminology used here is used only to describe specific embodiments used as an example and is not provided in a manner restricting further embodiments used as an example. In this case, the singular forms "a", "an", "of a(n)" and "the" are also intended to include the plural forms unless the context clearly indicates otherwise. It is also noted that the terms "comprises", "comprising", "has" and/or "having" if used here specify the presence of mentioned features, integers, steps, operations, elements and/or components but do not exclude the presence or the addition of one or more other features, integers, steps, operations, elements, components and/or groups thereof.

Various embodiments provide a sensor arrangement having an optimized group delay.

Figure 1:
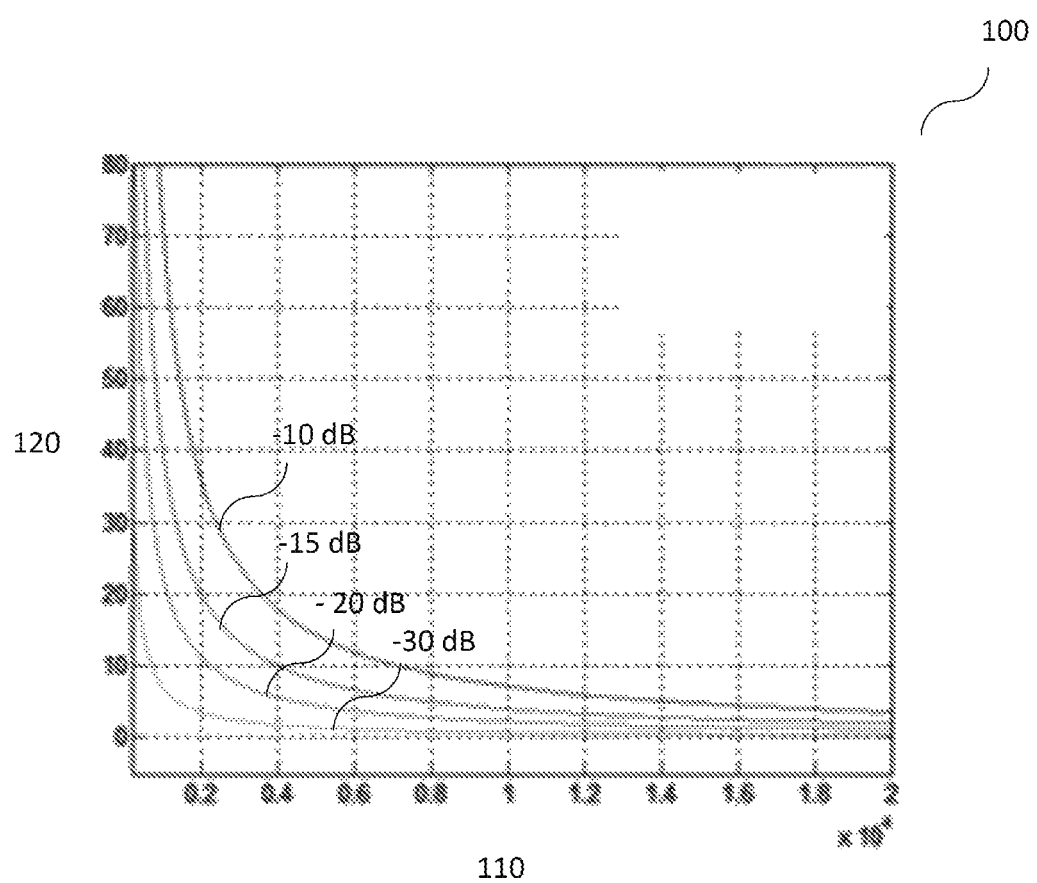
FIG. 1 shows a graph of the group delay of a sensor arrangement according to various embodiments.

FIG. 1 shows a graph 100 of the group delay 120, in units of µs, of a sensor arrangement, for example a microphone arrangement, as a function of the frequency 110 of the signal, in units of Hz, for different attenuations or suppressions of the ambient noise (−10 dB, −15 dB, −20 dB, −30 dB), in which case −10 dB is the lowest attenuation and −30 dB is the greatest attenuation. It is clear from the graph 100 that the requirement imposed on the group delay increases with increasing attenuation. In other words, in order to be able to attenuate the ambient noise more greatly, it is necessary to reduce the group delay of the arrangement over a wide frequency range. The attenuation of the ambient noise also improves the signal-to-noise ratio. Good attenuation can be achieved if the group delays of the components of the sensor arrangement are minimized.

FIG. 2 illustrates a block diagram of a section 200 of an embodiment of a sensor arrangement according to various embodiments.

The circuit arrangement has a sensor (not illustrated), an analogue/digital converter 202, a filter arrangement 212 and an interface 222.

In various embodiments, the sensor arrangement may also have a modulator 218 and/or a decimation filter which is described in yet more detail below.

In various embodiments, the filter arrangement 212 has a first filter 208 which is set up to reduce the group delay of a signal which is passing through, as described in yet more detail below.

In further embodiments, the filter arrangement 212 may have a second filter 214 which is clearly set up as a low-pass filter or a bandpass filter.

The first filter 208, the second filter 214 and the modulator 218 are clearly connected to the analogue/digital converter 202, with the result that the signal 206 provided by the analogue/digital converter 202 is processed or converted into a signal 220 provided by the modulator 218.

The sensor is set up to provide an analogue signal.

The analogue/digital converter 202 is set up to receive the analogue signal and to provide a first signal 206. Optionally, the analogue signal from the sensor can be amplified by means of an amplifier, for example a source follower, before it is received by the analogue/digital converter 202.

The first filter 208 is set up to receive a signal and to provide a second signal 210. The signal received by the first filter has a first group delay. The first filter 208 is set up to process the signal received by the first filter 208 in such a manner that the second signal 210 output by the first filter 208 has a second group delay, for example by means of suitable filter coefficients, as described in yet more detail below. The second group delay is shorter than the first group delay. For example, the second group delay in a frequency range of approximately 20 Hz to approximately 4 kHz is shorter, in a range of approximately −0.01 µs to approximately −25 µs, than the first group delay, for example by a value in a range of approximately −0.01 µs to approximately −15 µs, for example by a value in a range of approximately −5 µs to approximately −11 µs, for example −10 µs.

The second filter 214 is set up to receive a signal and is set up to provide a third signal 216.

The second filter 214 is a frequency-selective filter set up to reduce the amplitude of the signal received by the second filter 214 in a predefined frequency range, the predefined frequency range having a frequency of greater than 20 kHz.

The second filter 214 is, for example, a low-pass filter, a notch filter, a bandpass filter or a band stop filter. In this case, the second filter 214 is designed to reduce the amplitude of a high-frequency component of the signal output by the first filter. This makes it possible to prevent the downstream modulator from being overloaded.

For example, the second filter 214 is a low-pass filter and is set up to reduce the amplitude of the received signal above a frequency, the frequency being, for example, 22 kHz, 40 kHz, 50 kHz, 60 kHz, 70 kHz or 80 kHz. This frequency may also be referred to as the base frequency of the second filter. The amplitude may be negligible or substantially negligible above the base frequency, thus avoiding overloading of the modulator. Different group delays for the processed signal are associated with the different base frequencies. In this case, the higher the base frequency, the shorter the group delay of the processed signal. The higher the base frequency, the greater the amplitude of the unfiltered high-frequency component of the signal received by the modulator. The type of second filter and/or the base frequency of the second filter can be selected, that is to say optimized, in an application-specific manner. Application-specific optimization can be carried out, for example, on the basis of the type of modulator and the sampling frequency. For example, a higher base frequency can be selected if the modulator cannot process high-frequency signals, for example has an integrated bandpass or band stop filter. The modulator 218 is set up to receive a signal and is set up to provide a fourth signal 220. The signal received by the modulator 218 has the second group delay.

The fourth signal 220 provided by the modulator has a third group delay. The analogue signal has a fourth group delay. The third group delay of the analogue signal is shorter than the fourth group delay of the fourth signal 220 provided by the modulator at least in a frequency range of approximately 20 Hz to approximately 4 kHz.

In the example illustrated in FIG. 2, the first filter 208 is set up to receive the first signal, the second filter 214 is set up to receive the second signal and the modulator 218 is set up to receive the third signal. In other words: the sensor provides the analogue signal. The analogue/digital converter 202 receives the analogue signal and provides a first signal 206. The first filter 208 receives the first signal 206 and provides the second signal 210. The second filter 214 receives the second signal 210 and provides the third signal 216. The modulator 218 receives the third signal 216 and provides the fourth signal 220.

Furthermore, the interface 222 can be set up to receive the fourth signal 220 and can be set up to process the fourth signal 220 and to output a fifth signal 224. For example, the interface 222 may be set up to divide the signal to be output among a plurality of channels or pins.

The interface 222 may provide or may be set up to provide an environment outside the sensor arrangement with the fifth signal 224, for example may have a socket. An acoustic output device and/or optical output devices, for example a loudspeaker or a display, can be connected to the socket, for example. The output device may have further filters and/or signal-processing components which further process and change the signal provided at the interface.

The signals received and provided by the filters may each be a digital signal.

The first filter 208 reduces the group delay of the signal received by the first filter. As a result, the fourth signal 220 provided by the modulator may have a group delay which is shorter than the group delay of the analogue signal provided by the sensor. This makes it possible to more greatly attenuate or suppress the noise of the fourth signal. This makes it possible to improve the signal-to-noise ratio (SNR) of the sensor arrangement. In this case, the modulator may be optional if an unmodulated multi-bit (also referred to as an m-bit) output signal 224 is desired in an application-specific manner.

The second filter 214 can be used to reduce the amplitude of a high-frequency signal or signal component of the signal which is received by the modulator 218 and/or is provided by the interface 222. This prevents the modulator 218 being unnecessarily overloaded with data and signals. In the case of a microphone application, the second filter 214 may have a low-pass filter having a base frequency above the upper audible limit, that is to say above approximately 22 kHz. This makes it possible to retain a high sound quality and to simultaneously reduce the requirement imposed on the modulator 218 for signal processing.

The group delay is clearly reduced by means of a digital filter having a negative group delay. A negative group delay means that the signal output by the first filter has a shorter group delay than the signal received by the first filter.

The sensor arrangement is a linear time-invariant system. The signal output by the first filter has the same frequency as the signal received by the first filter on account of the linear behaviour of the sensor arrangement. However, the two signals differ in terms of the amplitude and the phase. The amplitude response is the ratio of the amplitudes of the received signal (input signal) and the provided signal (output signal) on the basis of the frequency. The phase response is the difference in the phase between the input signal and the output signal on the basis of the frequency.

The first filter is set up, for example by means of suitable selection of the filter coefficients, in such a manner that the phase response and the amplitude response are positive, that is to say have a positive gradient with increasing frequency, for example in the high-frequency range. The first filter therefore clearly amplifies the received signal in the high-frequency range. The high-frequency range begins from approximately 20 kHz, for example.

The group delay is defined as −1 times the derivative of the phase response according to the frequency. The positive phase response of the first filter therefore causes a negative group delay.

This can clearly be achieved by virtue of the first filter being set up in the form of an FIR (Finite Impulse Response) filter, for example. The FIR filter is set up in such a manner that a low-frequency signal has a gain of the amplitude of approximately 0 dB. A signal is a low-frequency signal in a frequency range of approximately 20 Hz to approximately 4 kHz, for example. The (same) FIR filter is also set up in such a manner that a high-frequency signal has a gain of the amplitude of greater than approximately 0 dB. A signal is a high-frequency signal, for example, with a frequency of greater than approximately 4 kHz, for example above a frequency of approximately 20 kHz and more. The FIR filter can also be set up in such a manner that it has a subharmonic of the amplitude gain in a frequency range (see FIG. 4B). The FIR filter may have a negative gain, that is to say attenuation, in the region of the subharmonic. The negative gain may be, for example, in the region of the resonant frequency of an oscillatory sensor of the sensor arrangement.

Such an FIR filter can be implemented at a given sampling frequency by means of suitable selection of the filter coefficients, for example.

In one embodiment, the circuit arrangement is in the form of a pressure sensor arrangement or has such a pressure sensor arrangement. Alternatively or additionally, the circuit arrangement is in the form of a microphone arrangement or has such a microphone arrangement.

The sensor may have a diaphragm, for example. In this case, a deflection of the diaphragm from a rest position may produce the analogue signal. The diaphragm is, for example, a micro-electromechanical structure (MEMS) or has such a structure. Alternatively or in other words, the sensor may be or have a micro-electromechanical structure.

In various embodiments, the microphone is used to record ambient sound, speech, music or the like and to provide a microphone signal. The recording or provision of a microphone signal may be understood as providing an electrical signal which depends on the ambient sound or, in other words, on the sound pressure acting on the microphone. Different microphone types can be used, for example electret microphones or other condenser microphones. A special example is a silicon microphone implemented as a micro-electromechanical system. That is to say, the diaphragm and other components which form the microphone can be produced using processing steps and techniques which are usually used in microprocessor production.

Some of the properties of the microphone which relate the resulting microphone signal to the acting sound pressure can be adjusted by means of hardware properties of the microphone itself, for example the rear volume or the rigidity of a diaphragm of the microphone.

According to the embodiment from FIG. 2 which is used as an example, the analogue/digital converter 202 is a multi-bit converter, with the result that the first signal is a multi-bit representation.

In one example, the first filter 208 is a finite impulse response (FIR) filter or has such a filter, for example a second-order FIR filter. The first filter is clearly set up in such a manner that the first filter 208 changes, that is to say reduces, the group delay of the received signal. The high-frequency component of the received signal, that is to say the wave packet which is enclosed by the envelope curve, is not changed by the first filter. The envelope curve is the amplitude profile of the wave packet and moves along with the group delay.

If the response function of the sensor has a resonant property or a resonant peak within the investigated spectrum, an FIR filter may be able to model the inverse of the frequency response of the microphone 102. According to some embodiments which are used as an example, the coefficients of the FIR filter are programmable or variable. This may be used to retain the desired filter properties if the sound control apparatus is operated at different sampling frequencies.

Alternatively, the first filter 208 is a recursive filter or has such a filter.

The first filter 208 has a base frequency in a range of approximately 10 kHz to approximately 40 kHz, for example in a range of approximately 16 kHz to approximately 30 kHz, for example in a range of approximately 16 kHz to approximately 22 kHz, for example in a range of approximately 25 kHz to approximately 35 kHz.

If the sensor arrangement is a microphone arrangement, the first filter 208 may have a base frequency in the range of approximately 16 kHz to approximately 22 kHz, for example. If the sensor arrangement is a pressure sensor arrangement, the first filter 208 may have a base frequency in the range of approximately 25 kHz to approximately 30 kHz, for example. One reason for the different base frequencies may be the application-specific different configuration of the sensor and its resonant frequency.

The first filter 208 is set up such that the first signal has a group delay which is less than or equal to 0 seconds in a frequency range of approximately 20 Hz to approximately 22 kHz.

The first filter 208 is set up such that the first signal has a group delay in a range of 0 seconds to approximately $-1 \cdot 10^{-5}$ seconds in a frequency range of approximately 20 Hz to approximately 22 kHz.

The first filter 208 is set up such that the first signal has a group delay minimum in a frequency range. The circuit arrangement may have a resonant frequency in this frequency range. The group delay minimum is, for example, in a frequency range of approximately 10 kHz to approximately 30 kHz.

Weaker attenuation of the input signal may cause a shorter group delay.

Alternatively, greater attenuation may result in a relatively longer group delay which may be less than 0 µs, however. It is therefore possible to select in an application-specific manner whether greater attenuation of a resonant signal from the sensor arrangement in a predefined frequency range is desired or alternatively a shorter group delay in the same frequency range or in a different frequency range is desired. This can be achieved by changing the attenuation of the first filter at a sampling frequency.

The first filter 208 may be set up such that the first signal has a gain of less than or equal to 0 dB in a frequency range of approximately 20 Hz to approximately 20 kHz.

The second filter 214 is a low-pass filter or has such a filter. A low-pass filter can be implemented as a digital filter. For example, the second filter 214 is a third-order low-pass filter or has such a filter.

The second filter 214 has, for example, a base frequency, for example 22 kHz, 40 kHz, 50 kHz, 60 kHz, 70 kHz or 80 kHz.

The base frequency of the second filter 214, that is to say the frequency above which the second filter 214 blocks transmission, corresponds to the base frequency of the first filter 208 in one embodiment.

The base frequency of the second filter 214 or the base frequency of the first filter 208 can also be referred to as a cut-off frequency, a pass frequency or a threshold value.

The signal received by the modulator 218 has a first word width. The modulator 218 is set up to process the signal received by the modulator 218 in such a manner that the fourth signal 218 provided by the modulator 218 has a second word width. The second word width is shorter than the first word width, for example the first word width is greater than 4 bits, for example greater than 8 bits, for example greater than 20 bits; and the second word width is less than 8 bits, for example less than 4 bits, for example 1 bit.

The fourth signal can be provided in any desired different representations. For example, a single-bit protocol can be used, with the result that the fourth signal is provided as a bit stream. Other implementations may provide the fourth signal as a sequence of bytes, for example in the hexadecimal system or in the decimal system. Further embodiments may provide a fourth signal as an analogue signal.

Some embodiments which are used as an example provide a fourth signal in a single-bit representation and can use the modulator 218 to provide the single-bit representation from a multi-bit representation which can be used in preceding processing steps inside the sensor arrangement.

A sensor arrangement according to some embodiments which are used as an example further includes one or more connections in order to make it possible to connect all components inside the sensor arrangement to further circuit arrangements, printed circuit boards or the like in a single mounting step by means of the connection (the connections).

Some embodiments of a sensor arrangement which are used as an example comprise a common housing arrangement which at least partially encloses the sensor and the further components, for example the amplifier, for example the source follower, the ADC converter, the filters 208, 214 and the modulator 218, the common housing arrangement having supply connectors for electrically connecting all components to further circuit arrangements. A sensor arrangement according to some embodiments used as an example may be understood as meaning an individual unit which can be handled as a discrete independent apparatus, with the result that the components inside the sensor arrangement can be connected to further apparatuses or circuit arrangements by electrically connecting the sensor arrangement overall to the further circuit arrangements. This may make it possible to reduce the number of connections used inside an application, for example by using a single supply voltage connection for the sensor and the further components inside the housing.

The modulator 218 of the sensor arrangement transfers a multi-bit representation into a single-bit representation according to one embodiment.

According to the embodiment from FIG. 2, a sampling frequency Fs of the analogue/digital converter 202 is variable, with the result that a plurality of sampling frequencies can be supported by the sensor arrangement. According to some embodiments of sensor arrangements which are used as an example, a property of the sensor arrangement 104 is variable, which may make it possible to achieve similar modification properties of the sensor arrangement for different sampling frequencies of the analogue/digital converter 202. The sampling frequency has a value in a range of approximately 1 MHz to approximately 4 MHz, for example.

In one embodiment, the first filter 208 is set up to receive the third signal, the second filter 214 is set up to receive the first signal 206 and the modulator 218 is set up to receive the second signal 210. In other words: the sensor provides the analogue signal. The analogue/digital converter 202 receives the analogue signal and provides a first signal 206. The second filter 214 receives the first signal 206 and provides the third signal 216. The first filter 208 receives the third signal 216 and provides the second signal 210. The modulator 218 receives the second signal 210 and provides the fourth signal 220.

FIG. 3A to FIG. 3D show block diagrams of various embodiments of a sensor arrangement 200, as already described above.

Figure 3A:
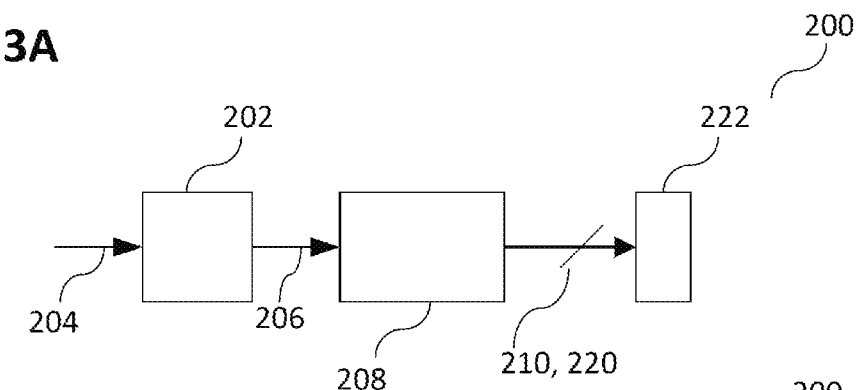
FIGS. 3A to 3D show block diagrams of various embodiments of a sensor arrangement.

In the embodiment illustrated in FIG. 3A, a low-pass filter, a modulator or a decimation filter is not provided in the sensor arrangement 200. However, such components may be provided downstream of the interface 222. For example, a loudspeaker connected to the interface 222 for the case of a microphone arrangement may have a low-pass filter, a modulator and/or a decimation filter.

In other words: the sensor provides the analogue signal. The analogue/digital converter 202 receives the analogue signal and provides a first signal 206. The first filter 208 is set up to receive a signal based on the first signal 206, for example the first signal 206, and provides the second signal 210 which can correspond substantially to the signal 220 provided to the interface 220. The first signal, the second signal and/or the signal provided by the sensor arrangement 200 at the interface 222 may each be a multi-bit signal, for example with the same word width or substantially the same word width.

Figure 3B:
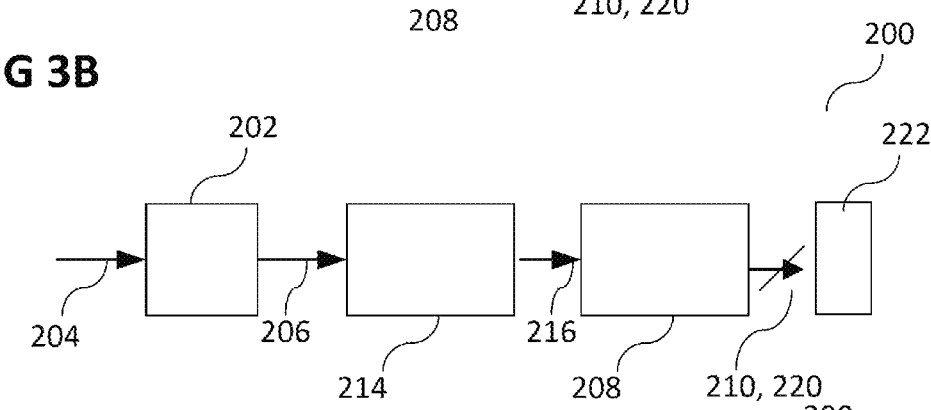

In the embodiment illustrated in FIG. 3B, a second filter 214 is also provided in the sensor arrangement 200 from FIG. 3A. In various embodiments, the sensor arrangement 200 is a linear, time-invariant system. The second filter 214 can therefore be arranged between the analogue/digital converter 202 and the first filter 208 and/or between the first filter 208 and the interface 222 with respect to the signal flow. The signal provided at the interface 222 is identical in both arrangements. The second filter 214 may be, for example, a multi-stage filter, for example a multi-stage low-pass filter. This makes it possible to reduce the amplitude of the high-frequency signal component of the signal provided at the interface 222, for example. In the case of a microphone arrangement, this means that the sound quality can be improved, for example. In other words: the second filter 214 can limit the high-frequency signal components which do not carry any information or substantially do not carry any information, also referred to as "out of band" energy. In some applications, the maximum amplitude is limited in the high-frequency signal components or limitation is required; for example, the amplitude response is intended to be below a predefined upper limit above a frequency of 40 kHz. In this case, the group delay according to FIG. 6A, which has a low-pass filter as a second filter, is used to comply with the "out of band" specification. The group delay is increased as a result of the second filter.

The signal provided at the interface 222 may be a multi-bit signal in this embodiment. The multi-bit signal may have, for example, the same word width or substantially the same word width as the first signal 206.

Figure 3C:
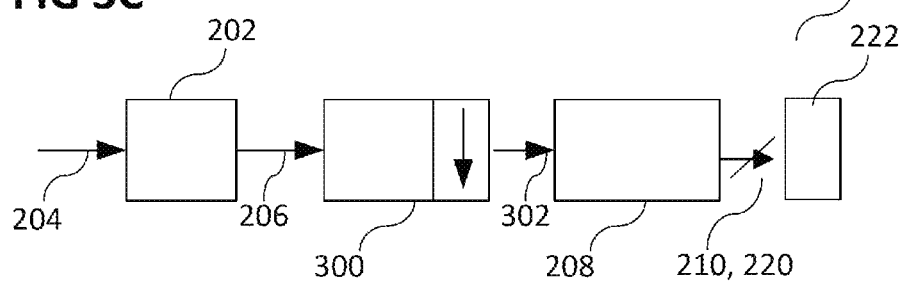
Figure 3D:
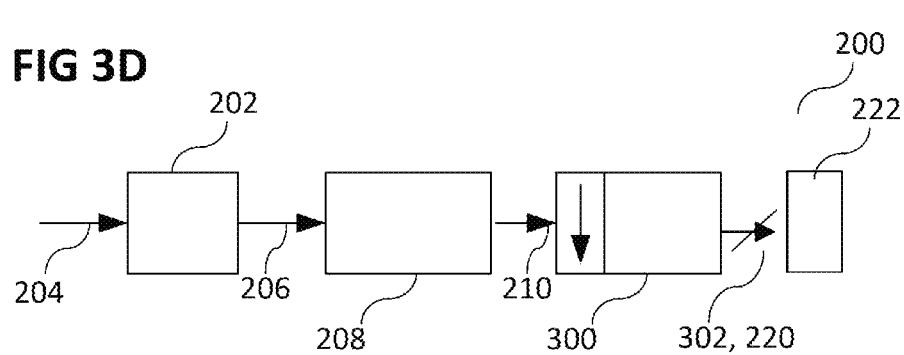

In the embodiments illustrated in FIG. 3C and FIG. 3D, a decimation filter 300 is also provided in the sensor arrangement 200 from FIG. 3A. The decimation filter is set up to provide a signal 302 with a reduced sampling rate, as described in yet more detail below. As an alternative or in addition to the decimation filter 300, it is possible to provide a filter which increases the sampling rate, for example an interpolation filter.

In various embodiments, the second filter 214 illustrated in FIG. 3B or its function may be additionally implemented in the first filter 208 or in the decimation filter 300.

In the embodiment illustrated in FIG. 3C, the decimation filter 300 is arranged between the analogue/digital converter 202 and the first filter 208 with respect to the signal flow. In the embodiment illustrated in FIG. 3D, the decimation filter 300 is arranged between the first filter 208 and the interface 222 with respect to the signal flow. The sensor arrangement 200 having the decimation filter 300 in various embodiments is no longer a linear, time-invariant system, as is the case in the embodiments in FIG. 3A, FIG. 3B. In this respect, the signal from the sensor arrangement 200 from FIG. 3C, as provided at the interface 222, differs from the signal from FIG. 3D, as provided at the interface 222, if the filters used in the sensor arrangements have the same filter coefficients.

The signal provided at the interface 222 may respectively be a multi-bit signal in these embodiments.

FIG. 3C clearly shows a sensor arrangement having group delay optimization if the signal from the sensor arrangement is intended to be provided at a lower sampling rate in an application-specific manner.

The decimation filter 300 can be used to reduce the sampling rate. The decimation filter can carry out low-pass filtering and can reduce the sampling rate.

The embodiment from FIG. 3D also shows that the first filter 208 can also be placed at the higher sampling rate of the first signal.

By means of the decimation filter, the modulator and/or the second filter become optional, for example may be dispensed with. A comparison of the group delay is clear from FIGS. 6B and 7 described in yet more detail below, from which it can be seen that the embodiments having a multi-bit interface additionally improve the group delay.

The analogue/digital converter is, for example, a third-order sigma-delta analogue/digital converter. The decimation filter may be a third-order comb filter, for example.

Figure 4A:
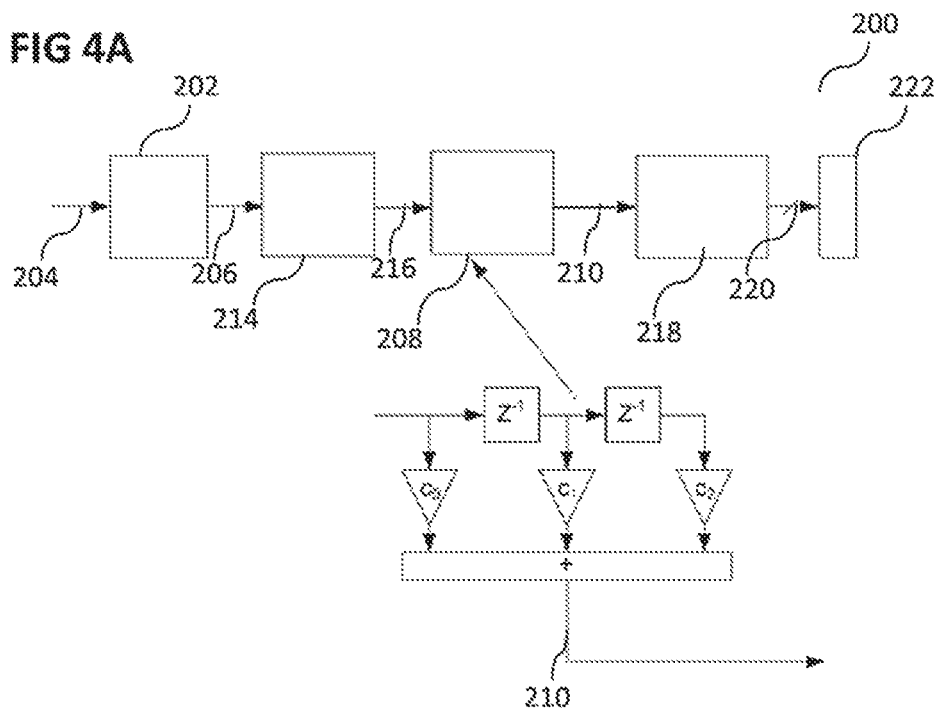
FIGS. 4A to 4C show block diagrams of various embodiments of a sensor arrangement.
Figure 4B:
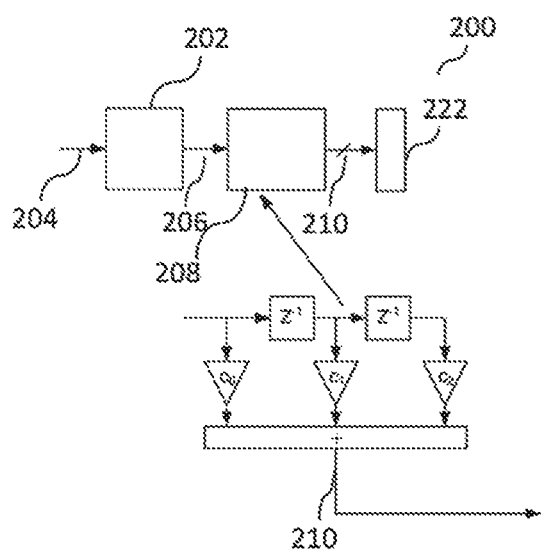

FIG. 4A, FIG. 4B also show, in further details, a first filter 208 in the form of a finite impulse response filter, for example in the form of a second-order finite impulse response filter. The first filter is part of a described sensor arrangement according to various embodiments. The finite impulse response filter operates in the time-discrete digital range and, during each processing step, provides an output signal which depends on the current input signal multiplied by a first scaling parameter (c0), for example $c_0=1227$. The input signal may be the signal received by the first filter 208.

The second signal 210 output by the first filter 208 also depends on the previous input signal or sample multiplied by an associated second scaling parameter $c_1$, for example $c_1=-2411$, and on the penultimate input signal multiplied by a third scaling parameter $c_2$, for example $c_2=1185$. The second signal 210 is the sum of a scaled input sample, a scaled preceding input sample and a scaled penultimate input sample.

For example, the first filter is a second-order FIR filter, the base frequency being approximately 20 kHz.

The second filter illustrated in FIG. 4A acts to stabilize the sensor arrangement and is, for example, a third-order wave digital filter, for example a Chebyshev filter, for example having a base frequency of 70 kHz.

In one embodiment, the second filter may be set up as an FIR filter.

Figure 4C:
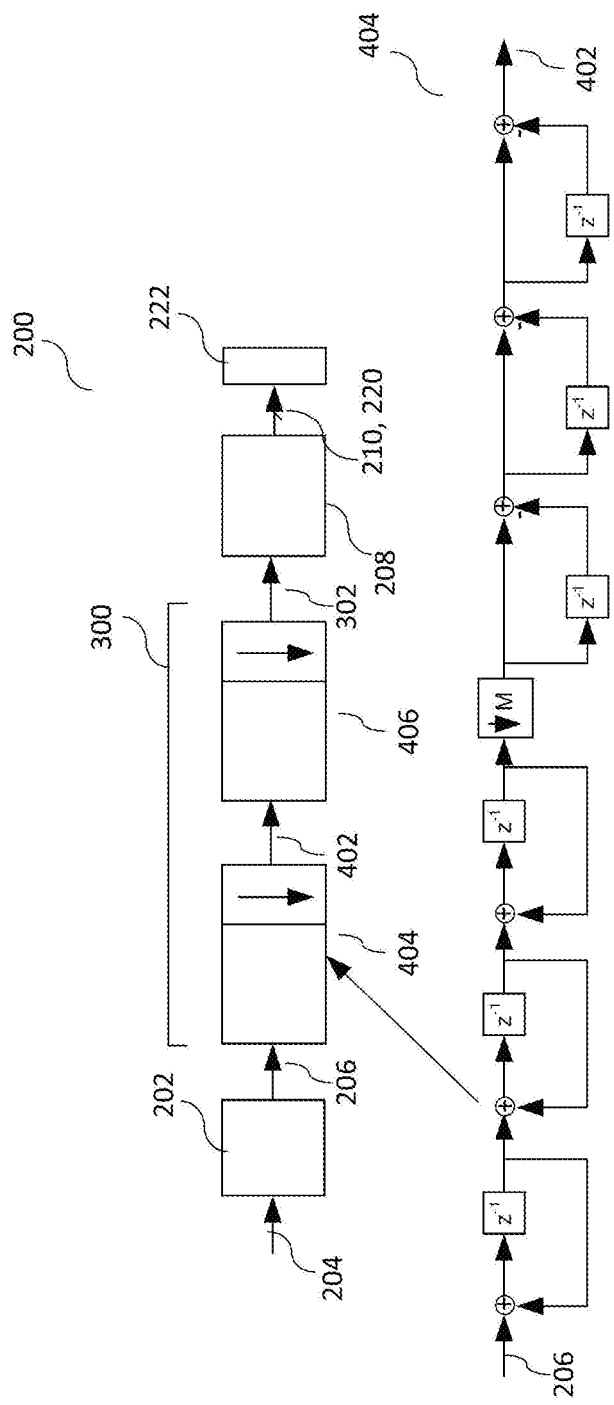

FIG. 4C shows, in further details, a decimation filter 300 of a sensor arrangement 200 according to various embodiments which corresponds substantially to a described embodiment.

The decimation filter may be set up in a single-stage or multi-stage form.

FIG. 4C shows, for example, a third-order two-stage decimation filter 300 having a first stage 404, which provides a decimated signal 402, and a second stage 406 which provides the signal 302 from the decimation filter 300. The second stage 406 can further reduce the sampling rate of the decimated signal 402. As a result, any desired decimations, for example, are possible, for example by a factor in a range of 2 to 48.

A decimation filter or a stage of a decimation filter may be set up as a comb filter, for example. The order of the decimation filter may correspond to the order of the analogue/digital converter.

As an alternative or in addition to the decimation filter, an interpolation filter may be provided in the sensor arrangement in order to increase the sampling rate. In combination with a second filter in the form of a blocking and/or pass filter, the frequency-dependent amplitude response can thereby be smoothed or attenuated in a predefined frequency range or a sampling rate predefined in an application-specific manner can be set.

Figure 5A:
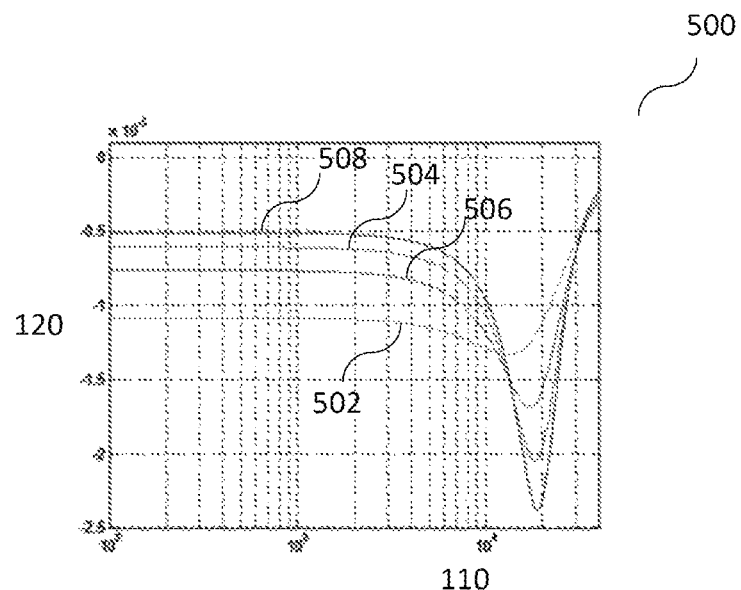
FIGS. 5A and 5B show illustrations of the frequency response of a filter from embodiments of a sensor arrangement.
Figure 5B:
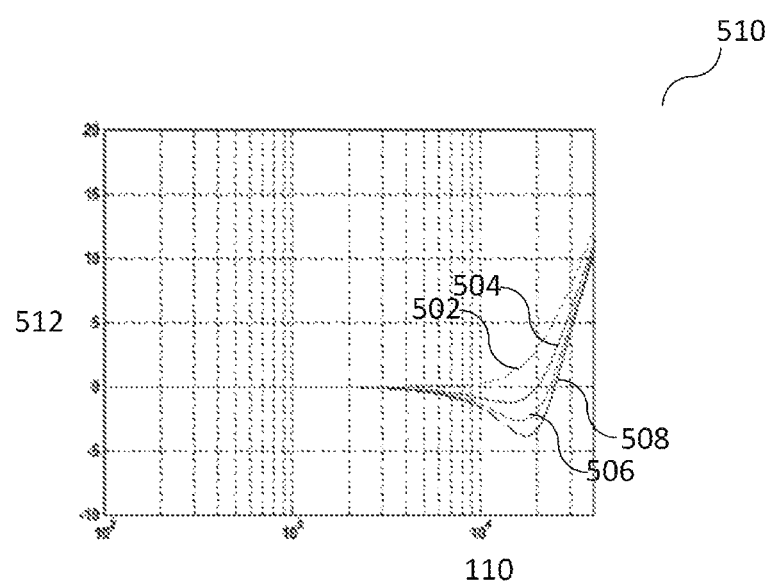

In various embodiments, the sensor arrangement may have a single filter which performs the described function of the first filter, the second filter and/or the decimation filter (or an interpolation filter), for example the amplitude and phase response described in FIG. 5A, FIG. 5B. In other words: the first filter and the second filter, that is to say their functionality, can be implemented in a single filter. The single filter can also be referred to as an overall filter. In other words: the overall filter has the first filter, the second filter and/or the decimation/interpolation filter. Alternatively, the overall filter has the function of the first filter, the function of the second filter and/or the function of the decimation/interpolation filter.

The first filter and/or the second filter may be zero-order, first-order, second-order, third-order filters or filters of an even higher order in various embodiments provided that this filter performs the described function. For example, the first filter has a phase response which increases positively with increasing frequency. The second filter is set up, for example, to reduce the amplitude of a high-frequency signal.

FIG. 5A and FIG. 5B show illustrations 500, 510 of the frequency response of a first filter from embodiments of a sensor arrangement described above. The first filter is implemented as a second-order FIR filter. The examples 502, 504, 506, 508 of the first filter, as illustrated in FIG. 5A, FIG. 5B, have different attenuation values of the oscillatory system. The (normalized) attenuation may have a value between 0 and 1, in which case a resonator is present for a value of 0 and any oscillation is suppressed for a value of 1. The first example 502 has the greatest attenuation among the four examples 502, 504, 506, 508 and the fourth example 508 has the lowest attenuation among the four examples 502, 504, 506, 508. The second example 504 and the third example 506 are intermediate values.

The x axis 110 in FIG. 5A, FIG. 5B shows the frequency in units of Hz. In FIG. 5A, the y axis 120 shows the group delay 120, in units of seconds, through the first filter. In FIG. 5B, the y axis 512 shows the gain in units of dB. A negative gain corresponds to an attenuation of the signal amplitude of the signal received in the first filter when passing through the first filter.

FIG. 5A and FIG. 5B show the group delay 120 and the gain 512 of signals through first filters having a different base frequency.

In the illustrated frequency range of approximately 100 Hz to approximately 4 kHz, the group delay 120 and the gain 512 are substantially linearly dependent or substantially constant, that is to say independent of the frequency 110 of the signal received by the first filter. Substantially a 1-to-1 representation of the signal received by the first filter is therefore performed in this frequency range.

The first filter, which has a long group delay in this frequency range, which is less than zero however, has a shorter group delay and a small gain or greater attenuation in the frequency range between approximately 10 kHz and approximately 40 kHz than a first filter which has a shorter group delay in the frequency range of approximately 100 Hz to approximately 3 kHz. The group delay through the first filter is dependent on the base frequency of the first filter. The greater the base frequency, the shorter the group delay in the frequency range of approximately 100 Hz to approximately 3 kHz, but also the greater the attenuation (see FIG. 5B) of the signal in the frequency range between approximately 10 kHz and approximately 40 kHz.

A resonant frequency of a sensor of the sensor arrangement may be arranged in the frequency range between approximately 10 kHz and approximately 30 kHz, to which sensor the first filter is connected, that is to say the signal provided by the first filter is based on the signal provided by the sensor. The first filter may therefore be suitable for attenuating the oscillation of the sensor of the sensor arrangement. The strong resonant peak of the first filter at approximately 19 kHz reduces the signal-to-noise ratio of the signal from the sensor, which may be an unwanted behaviour.

The positive gain of the signal, as illustrated in FIG. 5B, may result, in high-frequency ranges, for example above 40 kHz, in a significant gain in the amplitude of frequency ranges which are otherwise substantially negligible. For example, the amplitude of the analogue signal from the sensor is low and substantially negligible in this range. It is possible to override the modulator by means of the gain of the signal in these frequency ranges through the first filter. The second filter, for example in the form of a low-pass or bandpass filter having a base frequency above 40 kHz for example, may filter the high-frequency components, thus preventing overriding of the modulator.

In other words: the amplitude response, that is to say the gain of the first filter, is flat in the passband range of the second filter and higher frequencies are amplified by the first filter. The second filter therefore stabilizes the arrangement and prevents overriding of the modulator.

A positive group delay is again associated with the second filter. In order to obtain an optimized group delay for the overall arrangement, the first filter and the second filter are therefore tuned to one another. The second filter has a base frequency which is as low as possible, for example close to the band limit of the second filter. The first filter has a base frequency which is as high as possible. This ensures the stability of the overall arrangement. Furthermore, the (positive) group delay of the overall arrangement can be kept as short as possible thereby. This provides a sensor arrangement having an optimized group delay.

If a multi-bit output signal (also referred to as an m-bit) is permissible or desired in an application-specific manner, the second filter is optional or may have a very high pass frequency. The word width, that is to say the number of bits, of the signal provided by the sensor arrangement can be set to a predefined value by means of an above-described modulator or decimation or interpolation filter. The predefined value may have a value in a range of 1 bit to 1024 bits for example, for example in a range of 1 bit to 128 bits for example, to 64 bits for example, to 32 bits for example, to 16 bits for example, to 8 bits for example, to 4 bits for example, to 2 bits for example. However, it is not necessary for an item of amplitude information to be assigned to each of said bits. For example, higher bits may be assigned to a high-frequency signal component which is blocked by the second filter, however. The higher number of bits may be necessary, however, for the further signal processing in an application-specific manner. As a result, it is possible to dispense with a further modulator or a decimation/interpolation filter downstream, for example, or the latter may become optional.

Figure 6A:
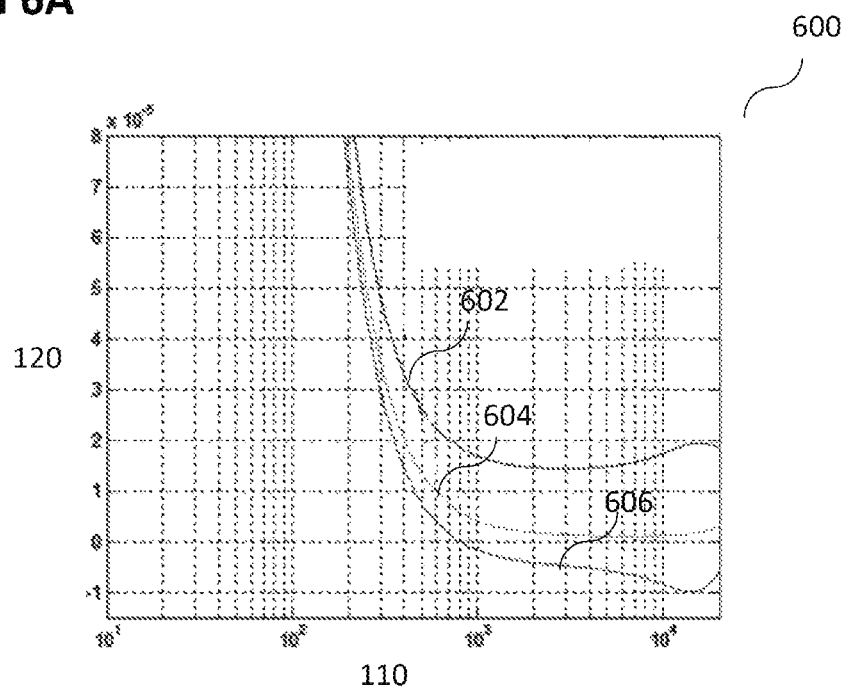
FIGS. 6A and 6B show graphs of the group delay of sensor arrangements according to various embodiments.
Figure 6B:
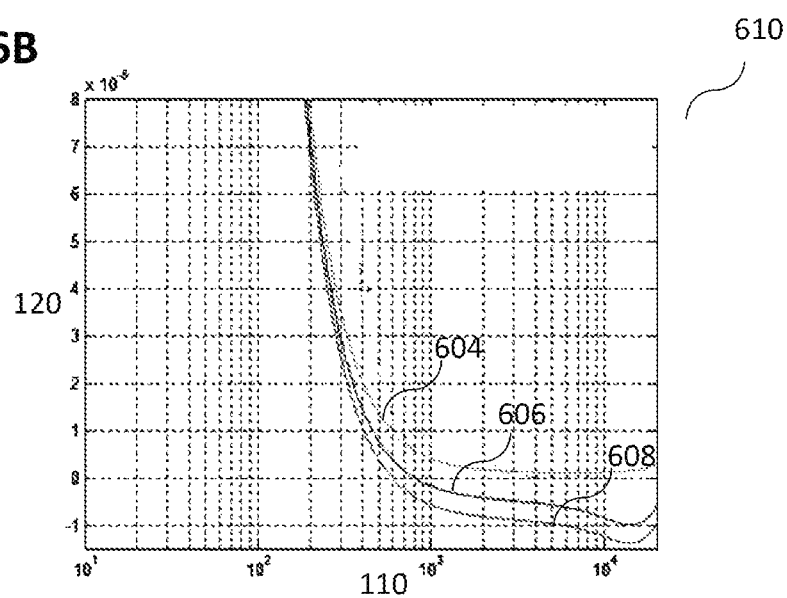
Figure 9:
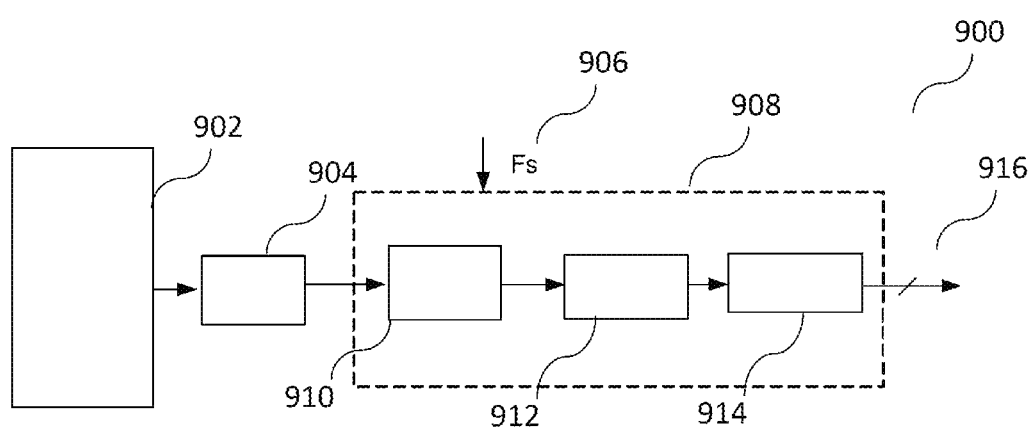
FIG. 9 shows a block diagram of a conventional microphone.

FIG. 6A, FIG. 6B show graphs 600, 610 of the group delay of a sensor arrangement. The frequency response of a MEMS structure 604, of a conventional microphone arrangement 602 according to FIG. 9, of an embodiment 606 according to one of the cited embodiments with a low-pass filter and a modulator, and of an embodiment 608 according to one of the cited embodiments without a low-pass filter, a decimation filter or modulator, that is to say only with a first filter, is illustrated. The x axis 110 shows the frequency in units of Hz and the y axis 120 shows the group delay 120, in units of seconds, through the respective sensor arrangement.

It is clear from FIG. 6A, FIG. 6B that the sensor arrangement according to various embodiments has a shorter group delay than a conventional sensor arrangement and has a shorter group delay than a MEMS used in these sensor arrangements. The shorter group delay allows greater attenuation of interference signals, as described in FIG. 1. This makes it possible to provide a sensor arrangement having an improved signal-to-noise ratio. Without a second filter, that is to say in the example 608, the group delay may also be reduced even further based on the example 606 with the second filter since the increase in the group delay of the signal through the second filter is dispensed with.

Figure 7:
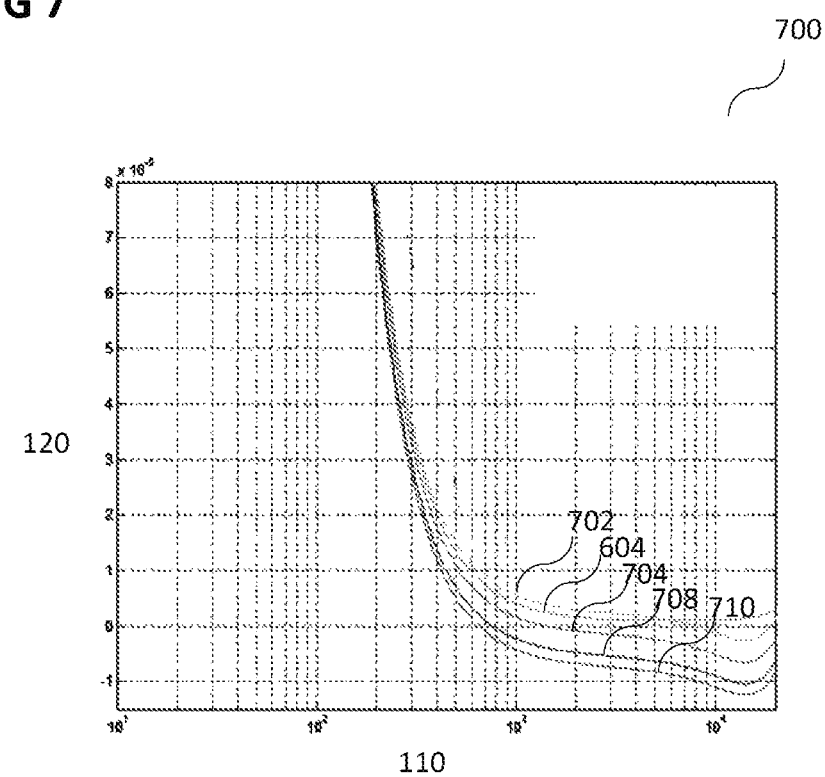
FIG. 7 shows a graph of the group delay of a sensor arrangement according to various embodiments.

FIG. 7 shows a graph 700 of the group delay of a sensor arrangement. The frequency response of a MEMS structure 604 from embodiments with a decimation filter 702, 704, 708, 710 with a different decimation stage (710: factor 4, 708: factor 8, 704: factor 16, 702: factor 24) according to one of the cited embodiments with a decimation filter is illustrated. In this case, the decimation filter may be set up in a single-stage or multi-stage form. In the case of a multi-stage decimation filter, the individual stages may have the same decimation factor or a different decimation factor. The decimation factor or factor indicates the degree by which the sampling rate is reduced.

The x axis 110 shows the frequency in units of Hz and the y axis 120 shows the group delay 120, in units of seconds, through the respective sensor arrangement.

It is clear from FIG. 7 that the group delay in the signal range illustrated, for example for frequencies of greater than 1 kHz, is significantly longer with increasing factor, that is to say with decreasing sampling rate. Accordingly, an optimized group delay can be determined in an application-specific manner by means of a compromise between the group delay and the sampling rate.

Figure 8:
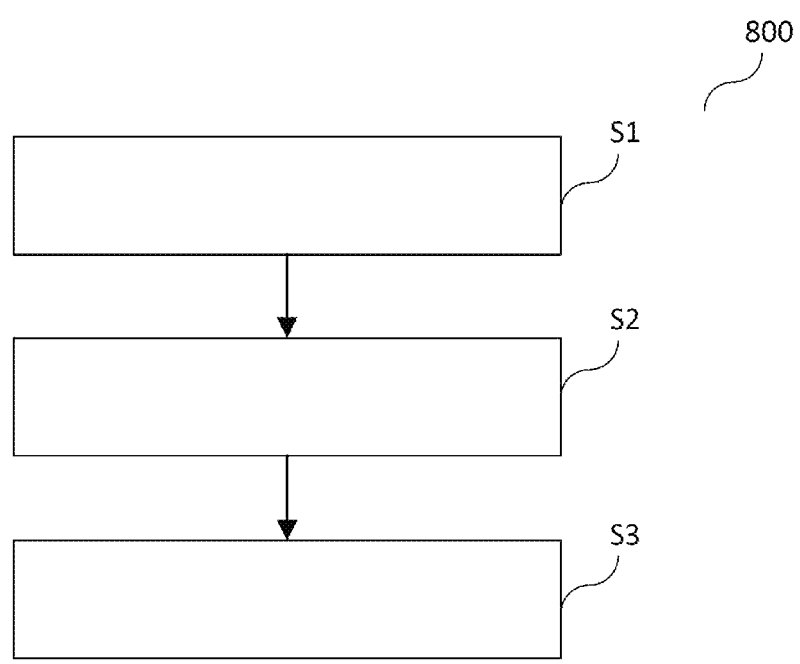
FIG. 8 shows a diagram of a signal processing method according to various embodiments.

FIG. 8 shows a diagram of a signal processing method according to various embodiments. The method 800 comprises providing S1 an analogue signal, converting S2 the analogue signal into a digital first signal and processing S3 the first signal to form a second signal. The first signal has a first group delay and the second signal has a second group delay, the second group delay being shorter than the first group delay. The first signal has a first word width and the second signal has a second word width, the second word width being shorter than the first word width.

The signal processing can be carried out using a circuit arrangement described above, for example. The circuit arrangement may be in the form of a pressure sensor arrangement, for example, or may have such a pressure sensor arrangement. Alternatively or additionally, the circuit arrangement may be in the form of a microphone arrangement or may have such a microphone arrangement.

The analogue signal may be generated, for example, by deflecting a diaphragm of a sensor of the sensor arrangement. The diaphragm is a micro-electromechanical structure, for example, or has such a structure.

The first signal can be processed S3 to form a second signal by means of a signal run through a first filter which is or has, for example, an FIR filter, for example a second-order FIR filter.

The first filter may have a base frequency in a range of approximately 16 kHz to approximately 30 kHz, for example in a range of approximately 16 kHz to approximately 22 kHz. The first filter may be set up in such a manner that the first signal has a group delay minimum in a frequency range, the circuit arrangement having a resonant frequency in this frequency range. The first filter may be set up, for example, such that the first signal has a gain of less than or equal to 0 dB in a frequency range of approximately 20 Hz to approximately 4 kHz.

Alternatively or additionally, the first signal can be processed S3 to form a second signal by means of a signal run through a second filter which is or has a low-pass filter, for example. The second filter may have a base frequency of greater than or equal to 20 kHz.

Example 1, which is described with reference to FIG. 1 to FIG. 8, is a circuit arrangement having a sensor. The sensor is set up to provide an analogue signal. The circuit arrangement also has an analogue/digital converter which is set up to receive the analogue signal and to provide a first signal. The circuit arrangement also has a first filter which is set up to provide a second signal. The circuit arrangement also has a second filter which is set up to provide a third signal. The circuit arrangement also has a modulator which is set up to provide a fourth signal. The first filter, the second filter and the modulator are connected to the analogue/digital converter, with the result that the first signal is processed or converted or changed to form the fourth signal. The signal received by the first filter has a first group delay, and the first filter is set up to process the signal received by the first filter in such a manner that the second signal output by the first filter has a second group delay, the second group delay being shorter than the first group delay. The second filter is set up, as a frequency-selective filter, to process the signal received by the second filter in such a manner that the amplitude of the signal received by the second filter is reduced in a predefined frequency range. The predefined frequency range has a frequency of greater than 20 kHz.

This makes it possible to reduce the group delay of a signal in the sensor arrangement. This makes it possible to more greatly attenuate interfering environmental signals without information being lost in the process. The signal-to-noise ratio of the sensor arrangement and therefore its sensitivity can therefore be improved. In addition, overloading of the modulator is prevented.

In Example 2, the subject matter of Example 1 may also include the fact that the first filter is set up to receive the first signal, the second filter is set up to receive the second signal and the modulator is set up to receive the third signal.

In Example 3, the subject matter of Example 1 or 2 may also include the fact that the circuit arrangement is in the form of a pressure sensor arrangement or has such a pressure sensor arrangement.

In Example 4, the subject matter of one of Examples 1 to 3 may also include the fact that the circuit arrangement is in the form of a microphone arrangement or has such a microphone arrangement.

In Example 5, the subject matter of one of Examples 1 to 4 may also include the fact that the sensor has a diaphragm, a deflection of the diaphragm from a rest position generating the analogue signal.

In Example 6, the subject matter of Example 5 may also include the fact that the diaphragm is or has a micro-electromechanical structure.

In Example 7, the subject matter of one of Examples 1 to 6 may also include the fact that the first filter is or has an FIR filter.

In Example 8, the subject matter of one of Examples 1 to 7 may also include the fact that the first filter is or has a second-order FIR filter.

In Example 9, the subject matter of one of Examples 1 to 8 may also include the fact that the first filter has a base frequency in a range of approximately 16 kHz to approximately 22 kHz.

In Example 10, the subject matter of one of Examples 1 to 9 may also include the fact that the first filter is set up such that the first signal has a group delay minimum in a frequency range, the circuit arrangement having a resonant frequency in this frequency range.

In Example 11, the subject matter of one of Examples 1 to 10 may also include the fact that the first filter is set up such that the first signal has a gain of less than or equal to 0 dB in a frequency range of approximately 20 Hz to approximately 20 kHz.

In Example 12, the subject matter of one of Examples 1 to 11 may also include the fact that the second filter is or has a low-pass filter.

In Example 13, the subject matter of one of Examples 1 to 12 may also include the fact that the second filter has a base frequency in a range of approximately 40 kHz to approximately 80 kHz.

In Example 14, the subject matter of one of Examples 1 to 13 may also include the fact that the fourth signal has a third group delay and the analogue signal has a fourth group delay, the third group delay being shorter than the fourth group delay in a frequency range of approximately 20 Hz to approximately 20 kHz.

In Example 15, the subject matter of one of Examples 1 to 13 may also have an overall filter, the overall filter having the first filter and the second filter, or the overall filter having the function of the first filter and the function of the second filter.

In an Example 16, which is described with reference to FIG. 1 to FIG. 8, a signal processing method includes: providing an analogue signal, converting the analogue signal into a digital first signal; processing the first signal to form a second signal, the first signal having a first group delay and the second signal having a second group delay, the second group delay being shorter than the first group delay; and the first signal having a first word width and the second signal having a second word width, the second word width being shorter than the first word width.

Example 17, which is described with reference to FIG. 1 to FIG. 8, is a circuit arrangement having a sensor. The sensor is set up to provide an analogue signal. The sensor arrangement also has an analogue/digital converter which is set up to receive the analogue signal and to provide a first signal. The sensor arrangement also has a first filter which is set up to receive a signal based on the first signal and to provide a second signal. The first filter is set up such that the second signal is allowed through without amplification or substantially without amplification in a frequency range of approximately 20 Hz to approximately 10 kHz. The filter is also set up such that the second signal has a gain of greater than 0 dB at least above a predefined frequency which is greater than approximately 20 kHz.

This reduces the group delay of the first signal.

Allowing the signal received by the first filter through without amplification or substantially without amplification can be understood as meaning a 1-to-1 representation of the received signal with respect to the provided (second) signal in this frequency range, for example apart from a gain which can be attributed to a current ripple. Allowing a signal through without amplification or substantially without amplification may have a gain in the range of −3 dB to +3 dB, for example, in the frequency range.

For example, the first filter may be set up to amplify the received signal above a frequency of approximately 20 kHz, that is to say may have a gain in the amplitude of greater than 0 dB. However, the gain may also be greater than 0 dB above frequencies of greater than 10 kHz, see, for example, the profile of the signal curve 502 in FIG. 5B. In other words: the magnitude of the gain is not necessarily greater than 0 dB only above a frequency of approximately 20 kHz.

The gain above a frequency of approximately 20 kHz may have a linear or substantially linear profile. The linear or substantially linear dependence of the gain on the frequency relates to a representation of the gain of the signal in units of decibels (dB) in a logarithmic representation of the frequency, see, for example, signal gains in FIG. 5B for frequencies above 20 kHz. A linear dependence means that the profile of the frequency-dependent gain response of the signal can be approximated by a straight line. In this case, for a given frequency, the gain of the signal may differ slightly from the value of the straight line at this frequency. The gain of the signal may be, for example, in a range of approximately ±10%, for example ±5%, of the gain value of the straight line. A substantially linear dependence can still be assumed for such a deviation.

If the signal received by a filter is based on another, provided signal, it can be understood as meaning that the received signal is identical to the provided signal or the provided signal is initially also processed in another manner, for example by another filter, before it is received by the filter.

In an Example 18, the sensor arrangement of Example 17 also has a second filter which is connected to the analogue/digital converter and is set up to provide a third signal based on the first signal.

In an Example 19, the sensor arrangement of Example 18 also includes the fact that the second filter is set up, as a frequency-selective filter, to process the signal received by the second filter in such a manner that the amplitude of the signal received by the second filter is reduced in a predefined frequency range, the predefined frequency range having a frequency of greater than 20 kHz.

In an Example 20, the sensor arrangement of Examples 17 to 19 also has a modulator which is connected to the analogue/digital converter and is set up to provide a fourth signal based on the first signal.

In an Example 21, the sensor arrangement of Examples 17 to 20 also has a decimation filter which is connected to the analogue/digital converter and is set up to provide a fifth signal based on the first signal.

In an Example 22, the sensor arrangement of Examples 17 to 21 also has an interface for providing a sixth signal which is based on the second signal, the interface being set up to provide an environment outside the circuit arrangement with the sixth signal.

In an Example 23, the sensor arrangement of Example 22 also includes the fact that the sixth signal is a multi-bit signal.

In an Example 24, the sensor arrangement of Examples 17 to 23 also includes the fact that the circuit arrangement is in the form of a pressure sensor arrangement or has such a pressure sensor arrangement.

In an Example 25, the sensor arrangement of Examples 17 to 24 also includes the fact that the circuit arrangement is in the form of a microphone arrangement or has such a microphone arrangement.

In an Example 26, the sensor arrangement of Examples 17 to 25 also includes the fact that the sensor has a diaphragm, a deflection of the diaphragm from a rest position generating the analogue signal.

In an Example 27, the sensor arrangement of Example 26 also includes the fact that the diaphragm is a micro-electro-mechanical structure or has such a structure.

In an Example 28, the sensor arrangement of Examples 17 to 27 also includes the fact that the first filter is or has an FIR filter.

In an Example 29, the sensor arrangement of Examples 17 to 28 also includes the fact that the first filter is or has a second-order FIR filter.

In an Example 30, the sensor arrangement of Examples 17 to 29 also includes the fact that the first filter has a base frequency in a range of approximately 16 kHz to approximately 22 kHz.

In an Example 31, the sensor arrangement of Examples 17 to 30 also includes the fact that the first filter is set up such that the first signal has a group delay minimum in a frequency range, the circuit arrangement having a resonant frequency in this frequency range.

In an Example 32, the sensor arrangement of Examples 18 to 31 also includes the fact that the second filter is or has a low-pass filter.

In an Example 33, the sensor arrangement of Examples 18 to 32 also includes the fact that the second filter has a base frequency in a range of approximately 40 kHz to approximately 80 kHz.

In an Example 34, the sensor arrangement of Examples 17 to 33 also includes the fact that the signal provided by the sensor arrangement has a first group delay and the analogue signal has a second group delay, the first group delay being shorter than the second group delay in a frequency range of approximately 20 Hz to approximately 20 kHz.

In an Example 35, the sensor arrangement of Examples 18 to 34 also has an overall filter, the overall filter having the first filter and the second filter, or the overall filter having the function of the first filter and the function of the second filter.

In an Example 36, which is described with reference to FIG. 1 to FIG. 8, a signal processing method is described. The method includes providing an analogue signal, converting the analogue signal into a digital first signal and processing the first signal to form a second signal. The first signal has a first group delay and the second signal has a second group delay, the second group delay being shorter than the first group delay.

The method may require a sensor arrangement described above or may be carried out using such a sensor arrangement.

In an Example 37, the method of Example 36 also includes the fact that the first signal has a first word width and the second signal has a second word width, the second word width being shorter than the first word width.

Although the invention has been shown and described, in particular, with reference to particular embodiments, it should be understood by those familiar with the field that numerous modifications with respect to the configuration and details can be made without departing from the essence and scope of the invention defined by the following claims. The scope of the invention is therefore determined by the attached claims and the intention is to include all modifications which fall under the literal sense or the scope of equivalence of the claims.

It is noted that the functional blocks explained here should not be interpreted such that they mean that the corresponding functionality is necessarily implemented in a single hardware part or in a single apparatus. Instead, the various functionalities can be distributed among various apparatuses or can be implemented in a single apparatus. For example, the source follower, the amplifier, the analogue/digital converter, the sound control apparatus and the modulator of the sensor arrangement may be implemented as a single ASIC or a single apparatus in some examples, while they can be implemented using two or more separate apparatuses in other examples.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a sensor set up to provide an analogue signal;
an analogue-to-digital converter set up to receive the analogue signal and to provide a first signal;
a first filter set up to receive a signal based on the first signal and to provide a second signal;
the first filter being set up in such a manner that:
the second signal is allowed through without amplification or substantially without amplification in a frequency range of 20 Hz to 10 kHz, and
the second signal has a gain of greater than 0 dB at least above a predefined frequency which is greater than 20 kHz.

2. The circuit arrangement of claim 1, further comprising:
a second filter which is connected to the analogue-to-digital converter and is set up to provide a third signal based on the first signal.

3. The circuit arrangement of claim 2,
wherein the second filter is set up as a frequency-selective filter to process the signal received by the second filter in such a manner that an amplitude of the signal received by the second filter is reduced in a predefined frequency range, the predefined frequency range having a frequency of greater than 20 kHz.

4. The circuit arrangement of claim 1, further comprising:
a modulator which is connected to the analogue-to-digital converter and is set up to provide a fourth signal based on the first signal.

5. The circuit arrangement of claim 1, further comprising:
a decimation filter which is connected to the analogue-to-digital converter and is set up to provide a fifth signal based on the first signal.

6. The circuit arrangement of claim 1, further comprising:
an interface for providing a sixth signal which is based on the second signal, the interface being set up to provide the sixth signal to an environment outside the circuit arrangement.

7. The circuit arrangement of claim 6,
wherein the sixth signal is a multi-bit signal.

8. The circuit arrangement of claim 1,
wherein the circuit arrangement is in the form of a pressure sensor arrangement or has a pressure sensor arrangement.

9. The circuit arrangement of claim 1,
wherein the circuit arrangement is in the form of a microphone arrangement or having a microphone arrangement.

10. The circuit arrangement of claim 1,
wherein the sensor comprises a diaphragm, a deflection of the diaphragm from a rest position generating the analogue signal.

11. The circuit arrangement of claim 10,
wherein the diaphragm is or comprises a micro-electromechanical structure.

12. The circuit arrangement of claim 1,
wherein the first filter is or comprises a Finite Impulse Response filter.

13. The circuit arrangement of claim 1,
wherein the first filter is or comprises a second-order Finite Impulse Response filter.

14. The circuit arrangement of claim 1,
wherein the first filter has a base frequency in a range of 16 kHz to 22 kHz.

15. The circuit arrangement of claim 1,
wherein the first filter is set up such that the first signal has a group delay minimum in a frequency range, the circuit arrangement having a resonant frequency in this frequency range.

16. The circuit arrangement of claim 2,
wherein the second filter is or comprises a low-pass filter.

17. The circuit arrangement of claim 2,
wherein the second filter has a base frequency in a range of 40 kHz to 80 kHz.

18. The circuit arrangement of claim 1, wherein the phase response of the first filter is positive phase that causes a negative group delay.

19. The circuit arrangement of claim 2, further comprising:
an overall filter,
wherein the overall filter comprises the first filter and the second filter, or
wherein the overall filter comprises a function of the first filter and a function of the second filter.

20. A signal processing method, the method comprising:
providing an analogue signal;
converting the analogue signal into a digital first signal;
processing the first signal with at least a first filter to form a second signal, wherein a phase response of the first filter is positive phase that causes a negative group delay;
wherein the first signal comprises a first group delay and the second signal comprises a second group delay, the second group delay being shorter than the first group delay.

21. The signal processing method of claim 20,
wherein the first signal comprises a first word width and the second signal comprises a second word width, the second word width being shorter than the first word width.

22. The circuit arrangement of claim 18,
wherein the signal provided by the circuit arrangement has a first group delay, and
wherein the analogue signal has a second group delay, the first group delay being shorter than the second group delay in a frequency range of 20 Hz to 20 kHz.

* * * * *